(12) United States Patent
Vimercati et al.

(10) Patent No.: US 9,406,384 B2
(45) Date of Patent: Aug. 2, 2016

(54) MATCHING SEMICONDUCTOR CIRCUITS

(71) Applicant: Micron Technology, Inc., Boise, ID (US)

(72) Inventors: Daniele Vimercati, Besana in Brianza (IT); Andrea Marmiroli, Alzano Lombardo (IT)

(73) Assignee: Micron Technology, Inc., Boise, ID (US)

( * ) Notice: Subject to any disclaimer, the term of this patent is extended or adjusted under 35 U.S.C. 154(b) by 455 days.

(21) Appl. No.: 13/687,706

(22) Filed: Nov. 28, 2012

(65) Prior Publication Data

US 2014/0146616 A1 May 29, 2014

(51) Int. Cl.
*G11C 11/34* (2006.01)
*G11C 16/10* (2006.01)
*G11C 16/26* (2006.01)

(52) U.S. Cl.
CPC ............... *G11C 16/10* (2013.01); *G11C 16/26* (2013.01)

(58) Field of Classification Search
USPC .................................................. 365/185.22
See application file for complete search history.

(56) References Cited

U.S. PATENT DOCUMENTS

| | | | |
|---|---|---|---|
| 6,933,869 B1* | 8/2005 | Starr ..................... | G11C 5/147 341/120 |
| 7,259,979 B2 | 8/2007 | Sachan et al. | |
| 7,679,979 B1 | 3/2010 | Kim | |
| 7,864,588 B2 | 1/2011 | Betser et al. | |
| 7,894,227 B2 | 2/2011 | Inoue | |
| 2007/0210836 A1* | 9/2007 | Laulanet ........ | H03K 19/018528 327/100 |
| 2009/0079656 A1* | 3/2009 | Peyla ..................... | H01Q 1/273 343/860 |
| 2009/0231025 A1* | 9/2009 | Wang ....................... | G05F 1/56 327/543 |
| 2010/0032671 A1* | 2/2010 | Marshall ......... | H01L 21/823437 257/48 |
| 2012/0062257 A1* | 3/2012 | Baumann ........... | G01R 31/3181 324/750.02 |
| 2012/0106225 A1 | 5/2012 | Deng et al. | |

* cited by examiner

*Primary Examiner* — Hoai V Ho
*Assistant Examiner* — Pablo Huerta
(74) *Attorney, Agent, or Firm* — Dicke, Billig & Czaja, PLLC

(57) ABSTRACT

Devices, circuitry, and methods for improving matching between semiconductor circuits are shown and described. Measuring a difference in matching between semiconductor circuits may be performed with a test current generator and test current measurement circuit, and adjusting a threshold voltage of a semiconductor component of at least one circuit until the difference between the circuits is at a desired difference may be performed with a program circuit.

22 Claims, 6 Drawing Sheets

MATCHING SEMICONDUCTOR CIRCUITS

FIELD

The present disclosure relates generally to semiconductors, and in particular, in one or more embodiments, the present disclosure relates to matching MOS components.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure (e.g., a floating gate or charge trap), or other physical phenomena (e.g., phase change or polarization), determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as bit lines. In NAND flash architecture, a column of memory cells is coupled in series with only the first memory cell of the column coupled to a bit line.

The demand of higher density and larger page/word parallelism in memory devices results in an increasing number of circuits that are repeated on a die many times. Such circuits include, by way of example only and not by way of limitation, sense amplifiers, page buffers, program load registers, and the like. As the density of flash memory devices continues to increase, the tolerances for components, including the repeated circuits, in memory devices drops.

Many memory devices use matched circuits for such things as sense amplifiers, current mirrors, and the like. As the components of memories continue to decrease in size and as memory devices continue to increase in density, current margins for matched circuits also shrink. Matching is, in part, a function of the circuit area, with increased ability to match circuits leading to increased area of the components of the circuit. With current margins shrinking, matching smaller circuits is increasingly difficult.

For the reasons stated above, and for other reasons which will become apparent to those skilled in the art upon reading and understanding the present specification, there is a need in the art for improved matching in memory device circuitry.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Negative bias temperature instability (NBTI) is a reliability issue in semiconductor transistors. NBTI effects include the altering of a threshold voltage of an affected transistor, typically p-type transistors with negative gate to source voltages. Positive bias temperature instability (PBTI) functions similarly to NBTI, but typically on n-type devices biased in inversion, that is with positive bias applied to the gate. Even if a portion of these effects could be, in some cases, recovered by using some techniques, the remaining part is permanent.

NBTI and PBTI can be a result when a gate to source voltage on the transistor is applied for a long period of time, with a high electric field, or a combination thereof. The transistor threshold voltage may be changed by a small amount or a large amount, depending on how much time and/or voltage is applied to the transistor. NBTI results in an increase in the threshold voltage, with a consequent decrease in drain current and a decrease of transconductance in the transistor. Typically, the magnitude and duration of gate to source voltage on transistors is designed so as to reduce or eliminate NBTI.

Figure 1:
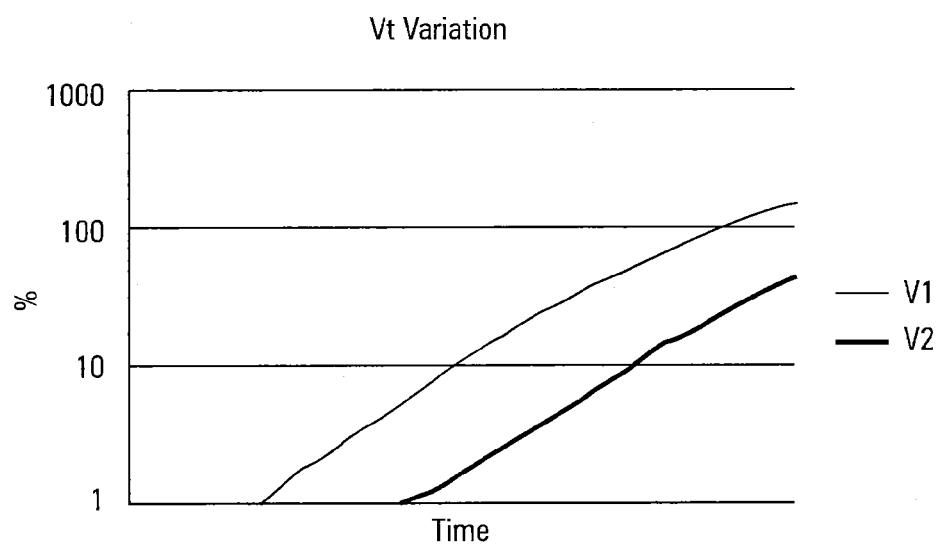
FIG. 1 is a diagram of threshold voltage variations dependent upon stress time for different voltages.

In standard working conditions, transistors are not typically altered. To accomplish this, typically a voltage low enough so as to avoid NBTI or PBTI is applied to the transistor gate, but sufficient to program the transistor to a non-permanent change in threshold voltage. Referring to FIG. 1, a threshold variation in percentage versus stress time for two different gate voltages is shown. The dependence of the slope of this function from the stress voltage is exponential.

Figure 2:
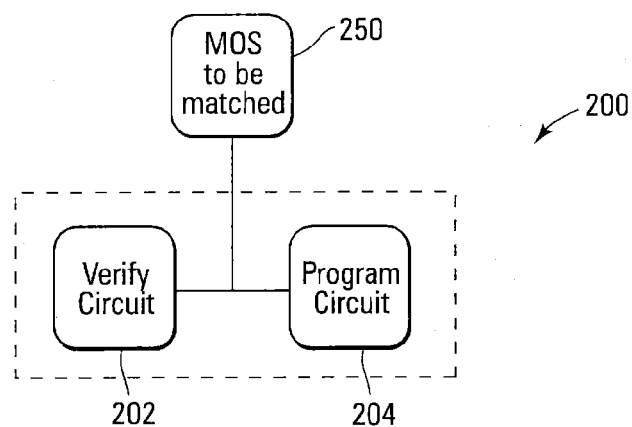
FIG. 2 is a block diagram of a matching circuit according to one embodiment of the present disclosure.

A circuit 200 for matching a semiconductor component of at least two semiconductor circuits is shown in block diagram form in FIG. 2. Circuit 200 comprises a verification circuit 202 and a program circuit 204. Circuit 200 is connected to the semiconductor circuits 250 to be matched. Semiconductor circuits may include, by way of example only and not by way of limitation, individual transistor pairs, sense amplifiers, current mirrors, and the like. In operation, the semiconductor circuits to be matched are connected to the program 204 and verification 202 circuits. The verification circuit 202 determines an offset between the semiconductor circuits 250, and if there is an offset larger than desired, the program circuit 204 applies sufficient voltage for a sufficient duration to permanently change the physical characteristics of at least one of the semiconductor circuits 250 to more closely match the other of the semiconductor circuits 250.

Verification circuit 202 comprises in one embodiment a test current generator connectable to a first semiconductor circuit of a pair of semiconductor circuits, and a test current measurement circuit connectable to a second semiconductor circuit of the pair of semiconductor circuits. The program circuit 204 is selectively connectable to the first semiconductor circuit and to the second semiconductor circuit to adjust a threshold voltage of a semiconductor component of a semiconductor circuit to which it is connected. Although examples are shown and discussed in the disclosure with respect to a pair of semiconductor circuits, one of skill in the art will appreciate that matching circuitry is also amenable to more closely match more than two circuits. Further, while measuring a current difference to detect mismatch between circuits is discussed, measuring a voltage difference may also be employed without departing from the scope of the disclosure.

Figure 3:
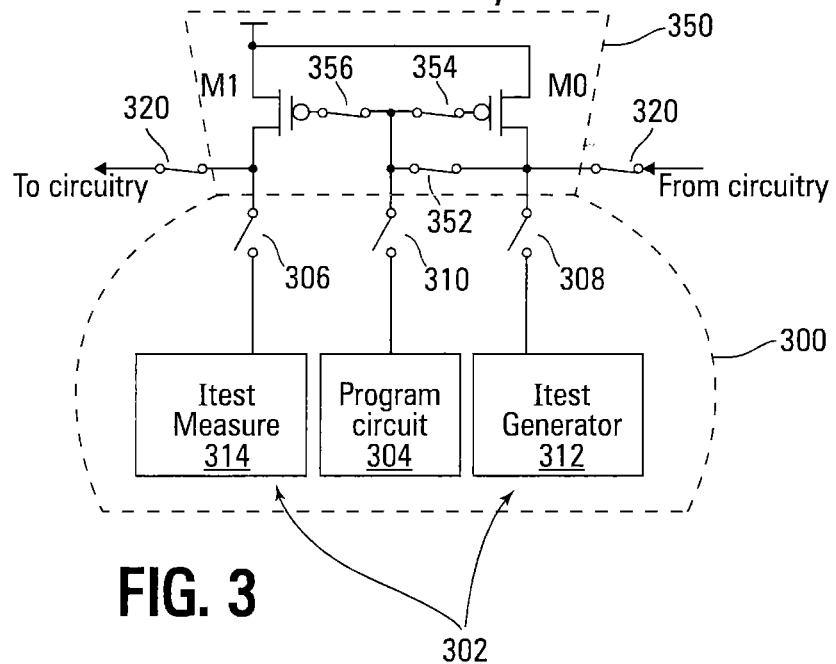
FIG. 3 is a circuit diagram of one matching circuit and current mirror circuit according to an embodiment of the present disclosure.

An example of the operation of a matching circuit, such as circuit 200, is shown in greater detail with reference to FIGS. 3-6. FIG. 3 is an example of a PMOS mirror circuit 350 in standard operating mode. In the PMOS circuit 350, switches 352, 354, and 356 are closed in normal current mirror operation. Switches 320 are closed to connect PMOS mirror 350 to remaining circuitry of a system of which PMOS mirror 350 is a part, such as a memory device or the like. Switches 306, 308, and 310 of matching circuit 300 are open, disconnecting PMOS mirror 350 from the matching circuit 300. In this configuration, the current mirror operates as a normal current mirror.

Figure 4:
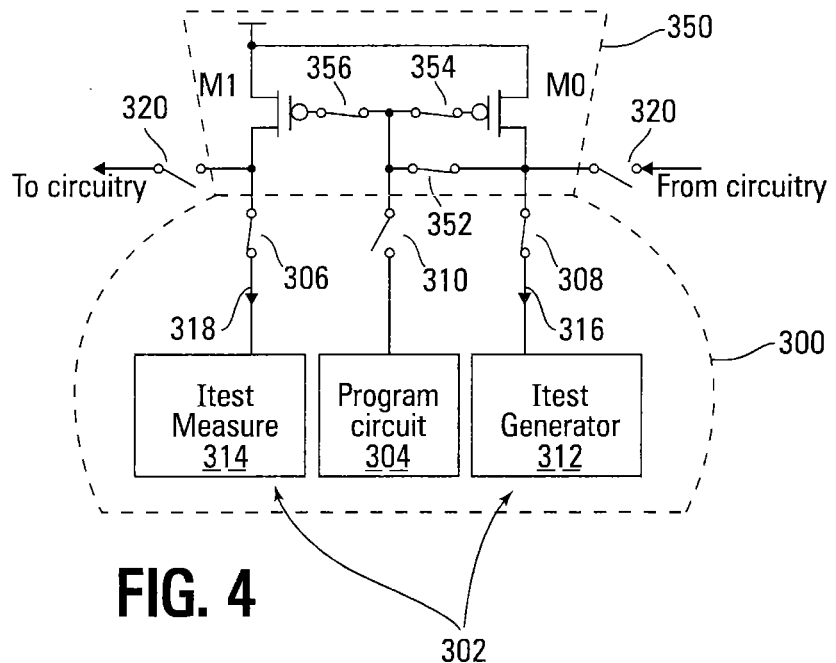
FIG. 4 is a circuit diagram of operation of the circuit of FIG. 3 in a current testing configuration.

FIG. 4 shows a match measuring configuration. In the match measuring configuration, switches 320 are opened to isolate the PMOS mirror 350 from the remaining circuitry of the system, and switches 306 and 308 are closed. Test current generator 312 is activated to generate a test current 316 through transistor M0, which is mirrored to transistor M1. Test current measurement circuit 314 measures the current 318 through transistor M1, and compares it to the generated test current to determine a difference between the test current and the measured mirror current. A desired matching offset in current between transistors M0 and M1 is used to determine whether any programming of transistor M0 or transistor M1 is desired to improve the match between the transistors. When the measured current 318 through transistor M1 is within a desired matched current range of a minimum match current and a maximum match current (e.g., M0 and M1 are matched to within a certain tolerance), no action is performed.

Figure 5:
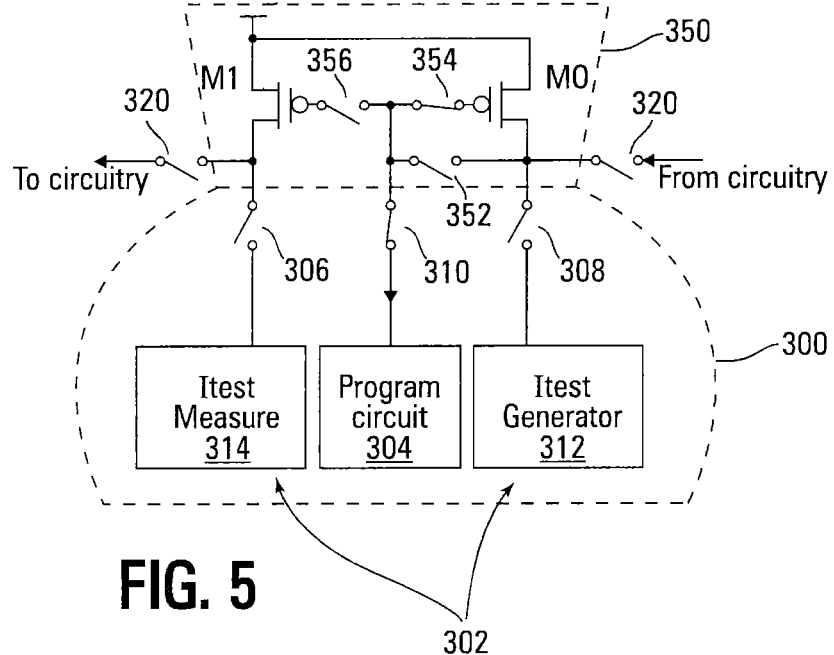
FIG. 5 is a circuit diagram of operation of the circuit of FIG. 3 in a first programming configuration.

Referring now to FIG. 5, when the measured test current 318 is less than the minimum match current, programming is performed on transistor M0 to raise its threshold voltage to match it to within the desired matched current range. This is performed by opening switches 306, 308, 352, and 356 to isolate transistor M0, closing switch 310 to connect transistor M0 to the program circuit 304, and programming transistor M0 with program circuit 304 to permanently adjust its threshold voltage to more closely match transistor M1.

Figure 6:
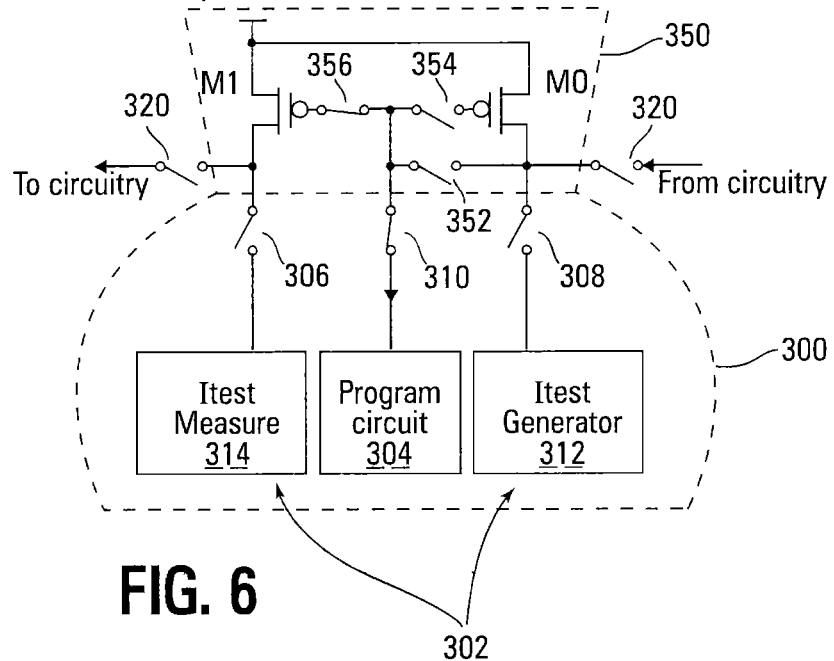
FIG. 6 is a circuit diagram of operation of the circuit of FIG. 3 in a second programming configuration.

Referring now to FIG. 6, when the measured test current 318 is greater than the maximum match current, programming is performed on transistor M1 to raise its threshold voltage to match it to within the desired matched current range. This is performed by opening switches 306, 308, 352, and 354 to isolate transistor M1, closing switch 310 to connect transistor M1 to the program circuit 304, and programming transistor M1 with program circuit 304 to permanently adjust its threshold voltage to more closely match transistor M0.

Figure 7:
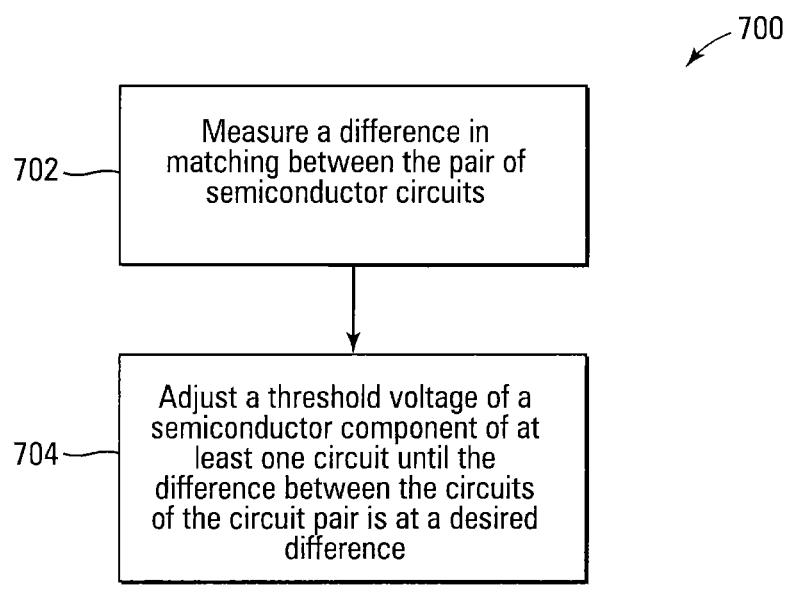
FIG. 7 is a flow chart diagram of a method according to an embodiment of the present disclosure.

Referring now to FIG. 7, a method 700 of matching a pair of semiconductor circuits is shown in flow chart diagram. Method 700 comprises, in one embodiment, measuring a difference in matching between the pair of semiconductor circuits in block 702, and adjusting a threshold voltage of a semiconductor component of at least one circuit until the difference between the circuits of the circuit pair is at a desired difference in block 704. Adjusting a threshold voltage of a component is accomplished in one embodiment by adjusting the threshold voltage using negative bias temperature instability, or by positive bias temperature instability, depending on the type of semiconductor component used in the semiconductor circuits. Adjusting in one embodiment comprises applying, with program circuit 304, at least one of a voltage sufficient to permanently adjust the threshold voltage, a current sufficient to permanently adjust the threshold voltage, and a program pulse of sufficient duration to permanently adjust the threshold voltage.

Figure 8:
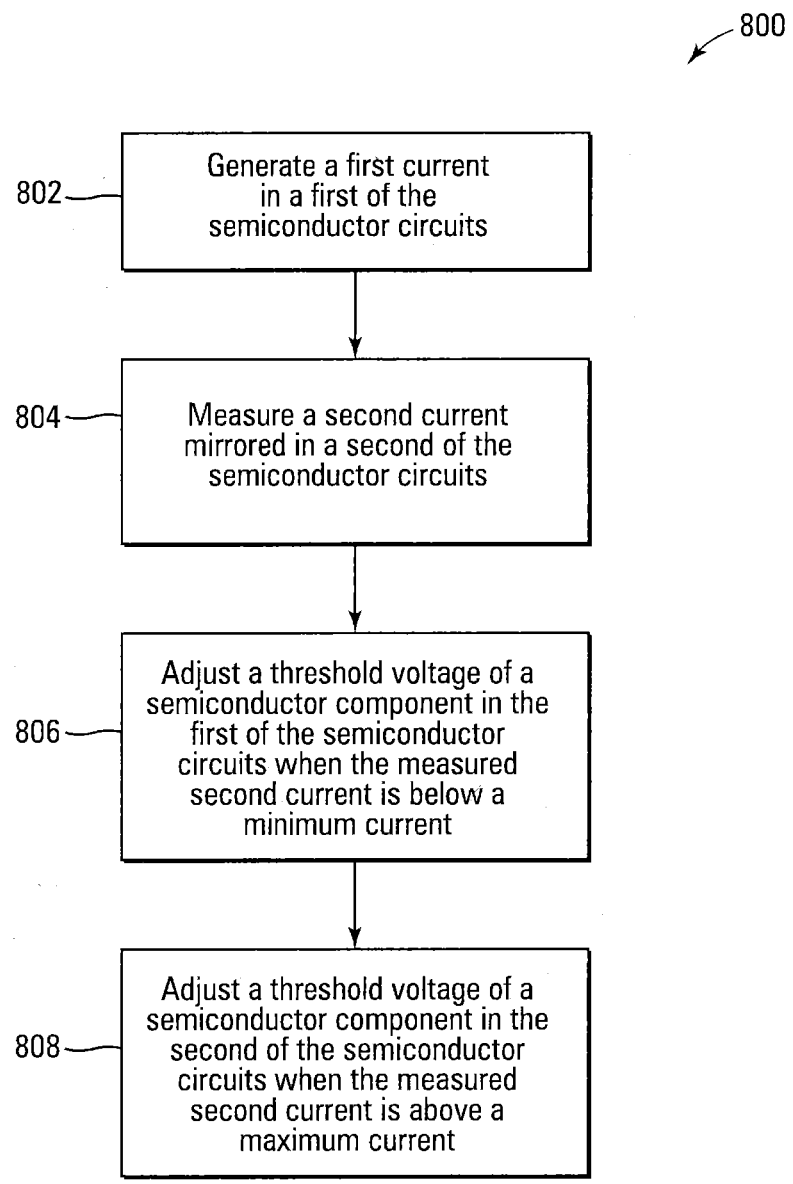
FIG. 8 is a flow chart diagram of a method according to another embodiment of the present disclosure.

Measuring a difference in matching between the pair of semiconductor circuits is accomplished in one embodiment by determining which of the pair of semiconductor circuits is to be adjusted. By way of example only and not by way of limitation, one such method 800 for determining is shown in FIG. 8. Method 800 comprises generating a first current in a first of the semiconductor circuits in block 802, measuring a second current mirrored in a second of the semiconductor circuits in block 804, adjusting a threshold voltage of a semiconductor component in the first of the semiconductor circuits when the measured second current is below a minimum current in block 806, and adjusting a threshold voltage of a semiconductor component in the second of the semiconductor circuits when the measured second current is above a maximum current in block 808.

Various embodiments of the present disclosure provide for matching of semiconductor circuits that are not as well matched as desired, by programming a component of the circuit to change its threshold voltage. In a complex device, such as a memory device or the like, matching and correction of matching can be done on a pair by pair basis, for example for such circuits as sense amplifiers, mirror circuits, differential circuits, and other circuits that use a matched pair of circuits. Further, the embodiments of the present disclosure are also amenable for use with two different and separated circuits that are to be matched, for example two circuits on the same chip that each perform the same function which are matched even though they are separate and independent. While positive and negative bias temperature instability have been discussed, it should be understood that other methods may be used to permanently alter threshold voltage may be used, and are within the scope of the disclosure.

Figure 9:
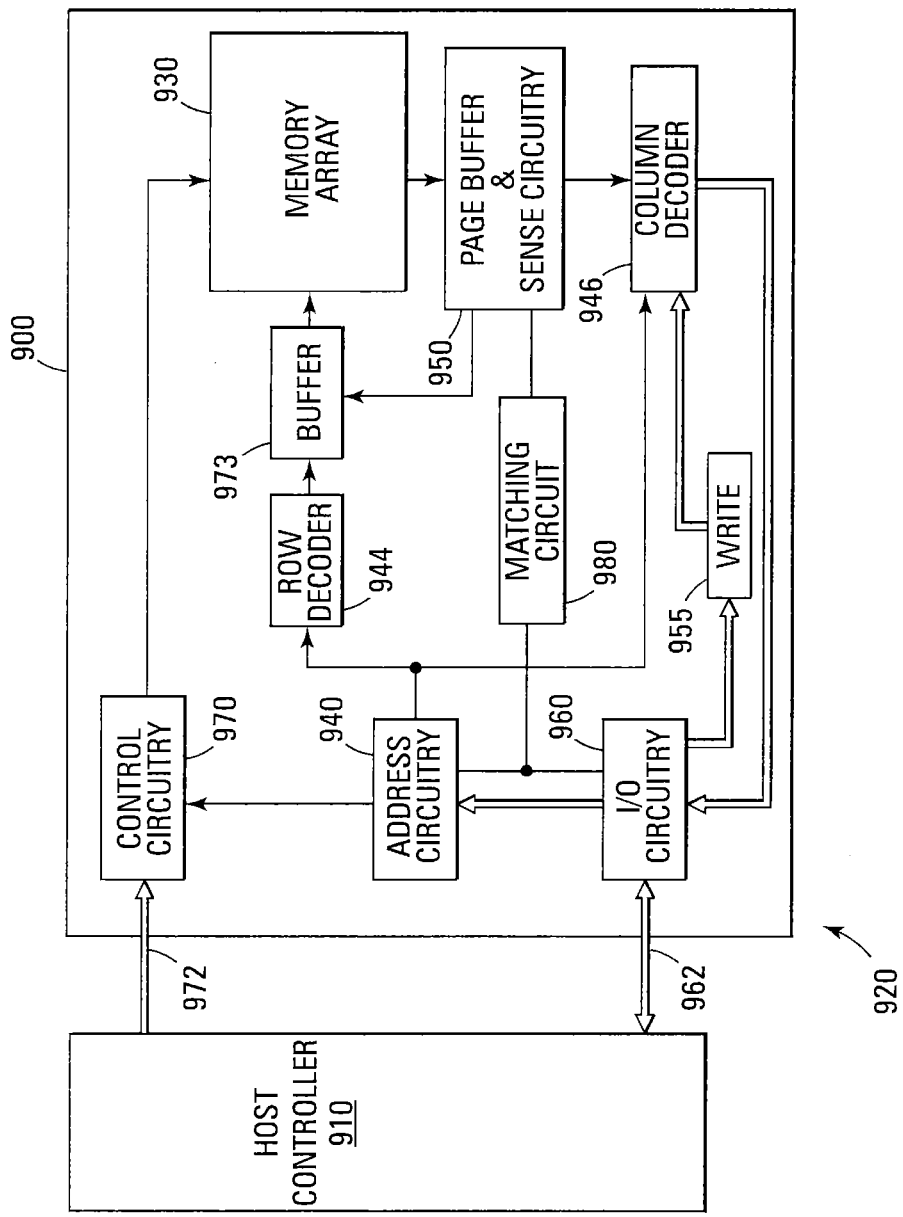
FIG. 9 is a block schematic of an electronic system in accordance with an embodiment of the disclosure.

FIG. 9 illustrates a functional block diagram of a memory device 900 that can implement matching circuitry and methods as described in FIGS. 1-8. The memory device 900 is coupled to an external controller 910 or other external circuitry. The external controller 910 may be a microprocessor or some other type of controller. The external controller 910 can be the host that is configured to transmit the write commands, as discussed previously. The memory device 900 and the external controller 910 form part of a system 920.

The memory device 900 includes an array 930 of memory cells (e.g., NAND architecture non-volatile memory cells). The memory array 930 is arranged in banks of word line rows and bit line columns. In one embodiment, the columns of the memory array 930 comprise series strings of memory cells.

Address buffer circuitry 940 is provided to latch address signals provided through I/O circuitry 960. Address signals are received and decoded by a row decoder 944 and a column decoder 946 to access the memory array 930. A row buffer 973 can be used to buffer data prior to input to the memory array 930.

The memory device 900 reads data in the memory array 930 by sensing voltage or current changes in the memory array columns using sense circuitry/page buffers 950. The sense circuitry 950, in one embodiment, is coupled to read and latch a row of data from the memory array 930. The sense circuitry 950, as previously described, includes the sense circuitry as well as other circuits (e.g., page buffers) for performing a program verify operation. The sense circuitry/page buffers 950 can move data to the row decoder 944 as well. Data are input and output through the I/O circuitry 960 for bidirectional data communication as well as the address communication over a plurality of data connections 962 with the controller 910. Write circuitry 955 is provided to write data to the memory array.

An internal memory controller (e.g., control circuitry and/or firmware) 970 decodes signals provided on a control interface 972 from the external host controller 910. These signals are used to control the operations on the memory array 930, including data read, data write (program), and erase operations. The internal memory controller 970 may be a state machine, a sequencer, or some other type of control circuitry that is configured to control generation of memory control signals.

A matching circuit 980 (such as matching circuits 200 or 300) may be selectively connected to address circuitry 940, page buffer/sense circuitry 950, I/O circuitry 960, and other circuitry that uses matched semiconductor circuits, to affect changes to those circuits for better matching as described herein.

The memory device illustrated in FIG. 9 has been simplified to facilitate a basic understanding of the features of the memory. A more detailed understanding of internal circuitry and functions of flash memories are known to those skilled in the art.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of matching semiconductor circuits, comprising:
   measuring a difference in matching between the semiconductor circuits;
   adjusting a threshold voltage of a semiconductor component of at least one of the semiconductor circuits in a permanent manner using a particular circuit until the difference between the semiconductor circuits is at a desired difference; and
   isolating the semiconductor component from the particular circuit for operation of the semiconductor circuits.

2. The method of claim 1, wherein adjusting a threshold voltage of a semiconductor component comprises adjusting the threshold voltage by inducing effects of negative bias temperature instability.

3. The method of claim 1, wherein adjusting a threshold voltage of a semiconductor component comprises adjusting the threshold voltage by inducing effects of positive bias temperature instability.

4. The method of claim 1, wherein adjusting a threshold voltage of the semiconductor component of at least one of the semiconductor circuits comprises programming the component with at least one of a voltage sufficient to permanently adjust the threshold voltage, a current sufficient to permanently adjust the threshold voltage, and a program pulse of sufficient duration to permanently adjust the threshold voltage.

5. The method of claim 1, wherein measuring a difference in matching further comprises determining which of the semiconductor circuits is to be adjusted.

6. The method of claim 5, wherein determining which of the semiconductor circuits is to be adjusted comprises:
   generating a first current in a first of the semiconductor circuits; and
   measuring a current mirrored in a second of the semiconductor circuits;
   wherein adjusting a threshold voltage comprises adjusting a threshold voltage of a semiconductor component in a first of the semiconductor circuits when the measured current is below a minimum current; and
   adjusting a threshold voltage of a semiconductor component in the second of the semiconductor circuits when the measured current is above a maximum current.

7. The method of claim 1, wherein adjusting a threshold voltage of a semiconductor component of at least one of the semiconductor circuits in a permanent manner using a particular circuit until the difference between the circuits is at a desired difference comprises adjusting the threshold voltage until the difference between the circuits is within a desired matching range.

8. A memory device, comprising
   semiconductor circuits;
   memory cells; and
   matching circuitry comprising:
      a verification circuit configured to determine an offset between the semiconductor circuits; and
      a program circuit configured to change a physical characteristic of a semiconductor component of at least one of the semiconductor circuits when an offset determined by the verification circuit is larger than desire;
      wherein the matching circuitry is configured to connect the program circuit to the semiconductor component to change the physical characteristic of the semiconductor component, and to isolate the program circuit from the semiconductor component for operation of the semiconductor circuits.

9. The memory device of claim 8, wherein the program circuit being configured to change a physical characteristic comprises the program circuit being configured to adjust a threshold voltage of the semiconductor component by adjusting the threshold voltage by inducing effects of negative bias temperature instability.

10. The memory device of claim 8, wherein the program circuit being configured to change a physical characteristic comprises the program circuit being configured to adjust a threshold voltage of the semiconductor component by adjusting the threshold voltage by inducing effects of positive bias temperature instability.

11. The memory device of claim 8, wherein the program circuit being configured to change a physical characteristic comprises the program circuit being configured to adjust a threshold voltage of the semiconductor component by programming the component with at least one of a voltage sufficient to permanently adjust the threshold voltage, a current sufficient to permanently adjust the threshold voltage, and a program pulse of sufficient duration to permanently adjust the threshold voltage.

12. The memory device of claim 8, wherein the program circuit being programmed to change a physical characteristic comprises the program circuit being configured to apply sufficient voltage for a duration sufficient to permanently change the physical characteristic of the semiconductor component.

13. The memory device of claim 8, wherein the verification circuit comprises a test current generator configured to generate a test current in a first of the semiconductor circuits; and a test current measurement circuit configured to measure a second current mirrored in a second of the semiconductor circuits, and wherein the program circuit being configured to change a physical characteristic of a semiconductor component comprises the program circuit being configured to adjust a threshold voltage of a semiconductor component in the first of the semiconductor circuits when the measured second current is below a minimum current, and to adjust a threshold voltage of a semiconductor component in the second of the semiconductor circuits when the measured second current is above a maximum current.

14. A circuit for matching semiconductor circuits, comprising:

a test current generator selectively connectable to a first semiconductor circuit;

a test current measurement circuit selectively connectable to a second semiconductor circuit; and a program circuit selectively connectable to the first semiconductor circuit and to the second semiconductor circuit to adjust a threshold voltage, in a permanent manner, of a semiconductor component of a semiconductor circuit to which it is connected;

wherein the circuit for matching semiconductor circuits is configured to isolate the program circuit from the first semiconductor circuit when it is connected to the second semiconductor circuit and to isolate the program circuit from the second semiconductor circuit when it is connected to the first semiconductor circuit.

15. A method of matching semiconductor circuits, comprising:

adjusting a physical characteristic of at least one circuit of the semiconductor circuits to match a physical characteristic of another circuit of the semiconductor circuits by inducing effects of bias temperature instability to permanently alter the physical characteristic of the at least one circuit; and isolating the semiconductor circuits from circuitry used to adjust the physical characteristic of the at least one circuit for a standard operating mode of the semiconductor circuits.

16. The method of claim 15, wherein adjusting a physical characteristic of at least one circuit of the semiconductor circuits comprises adjusting a threshold voltage of a component of the at least one circuit.

17. The method of claim 16, wherein adjusting a threshold voltage comprises adjusting a threshold voltage by inducing effects of negative bias temperature instability.

18. The method of claim 16, wherein adjusting a threshold voltage comprises adjusting a threshold voltage by inducing effects of positive bias temperature instability.

19. The method of claim 15, and further comprising:

measuring an offset between the semiconductor circuits; and wherein adjusting a physical characteristic comprises adjusting the physical characteristic of the at least one circuit until the offset between the semiconductor circuits is within a desired range.

20. The method of claim 19, wherein measuring an offset between the semiconductor circuits comprises mirroring a current in one circuit of the semiconductor circuits in an other circuit of the semiconductor circuits.

21. The method of claim 15, wherein adjusting a physical characteristic of at least one circuit of the semiconductor circuits comprises programming a component of the at least one circuit with at least one of an adjusted voltage and an adjusted duration program pulse.

22. The method of claim 15, wherein adjusting a physical characteristic of at least one circuit of the semiconductor circuits comprises adjusting a threshold voltage of a MOS device of the at least one circuit.

* * * * *